US012615714B2

(12) United States Patent
 Kong et al.

(10) Patent No.: US 12,615,714 B2
(45) Date of Patent: Apr. 28, 2026

(54) VERTICAL INTERCONNECT DESIGN FOR IMPROVED ELECTRICAL PERFORMANCE

(71) Applicant: Intel Corporation, Santa Clara, CA (US)

(72) Inventors: Jackson Chung Peng Kong, Tanjung Tokong (MY); Bok Eng Cheah, Gelugor (MY); Kok Hou Teh, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 783 days.

(21) Appl. No.: 17/857,055

(22) Filed: Jul. 4, 2022

(65) Prior Publication Data

US 2024/0008177 A1 Jan. 4, 2024

(51) Int. Cl.
 *H05K 1/11* (2006.01)
 *H05K 1/02* (2006.01)
 *H05K 3/40* (2006.01)

(52) U.S. Cl.
 CPC ........... *H05K 1/112* (2013.01); *H05K 1/0296* (2013.01); *H05K 3/4038* (2013.01); *H05K 2201/09545* (2013.01)

(58) Field of Classification Search
 CPC .... H05K 1/112; H05K 1/0296; H05K 3/4038; H05K 2201/09545; H05K 1/0245; H05K 1/0251; H05K 1/115
 See application file for complete search history.

(56) References Cited

U.S. PATENT DOCUMENTS

| | | | | |
|---|---|---|---|---|
| 5,191,174 A | * | 3/1993 | Chang | H05K 1/115 |
| | | | | 29/830 |
| 6,817,870 B1 | * | 11/2004 | Kwong | H01R 12/523 |
| | | | | 439/74 |
| 7,062,117 B2 | * | 6/2006 | Uchida | H05K 1/0274 |
| | | | | 385/14 |
| 7,326,856 B2 | * | 2/2008 | Takada | H05K 1/115 |
| | | | | 174/250 |
| 7,470,990 B2 | * | 12/2008 | Japp | H01L 23/564 |
| | | | | 257/760 |
| 7,999,192 B2 | * | 8/2011 | Chan | H05K 1/0216 |
| | | | | 174/262 |

* cited by examiner

*Primary Examiner* — Thienvu V Tran
*Assistant Examiner* — Muaamar Qahtan Al-Taweel
(74) *Attorney, Agent, or Firm* — Viering, Jentschura & Partner mbB

(57) ABSTRACT

The present disclosure is directed to a printed circuit board having a first surface and providing a signal pathway using a plurality of plated through hole (PTH) vias including a first set of PTH vias having a first PTH via coupled to a second PTH via and a first vertical separator being configured therebetween, with the first vertical separator extending a first depth from the first surface, and a second set of PTH vias having a third PTH via coupled to a fourth PTH via and a second vertical separator being configured therebetween, with the second vertical separator extending a second depth from the first surface, and a connector trace coupling the second PTH via to the third PTH via being positioned at a third depth from the first surface, for which the third depth is less than the first depth or the second depth.

20 Claims, 8 Drawing Sheets

FIG 5

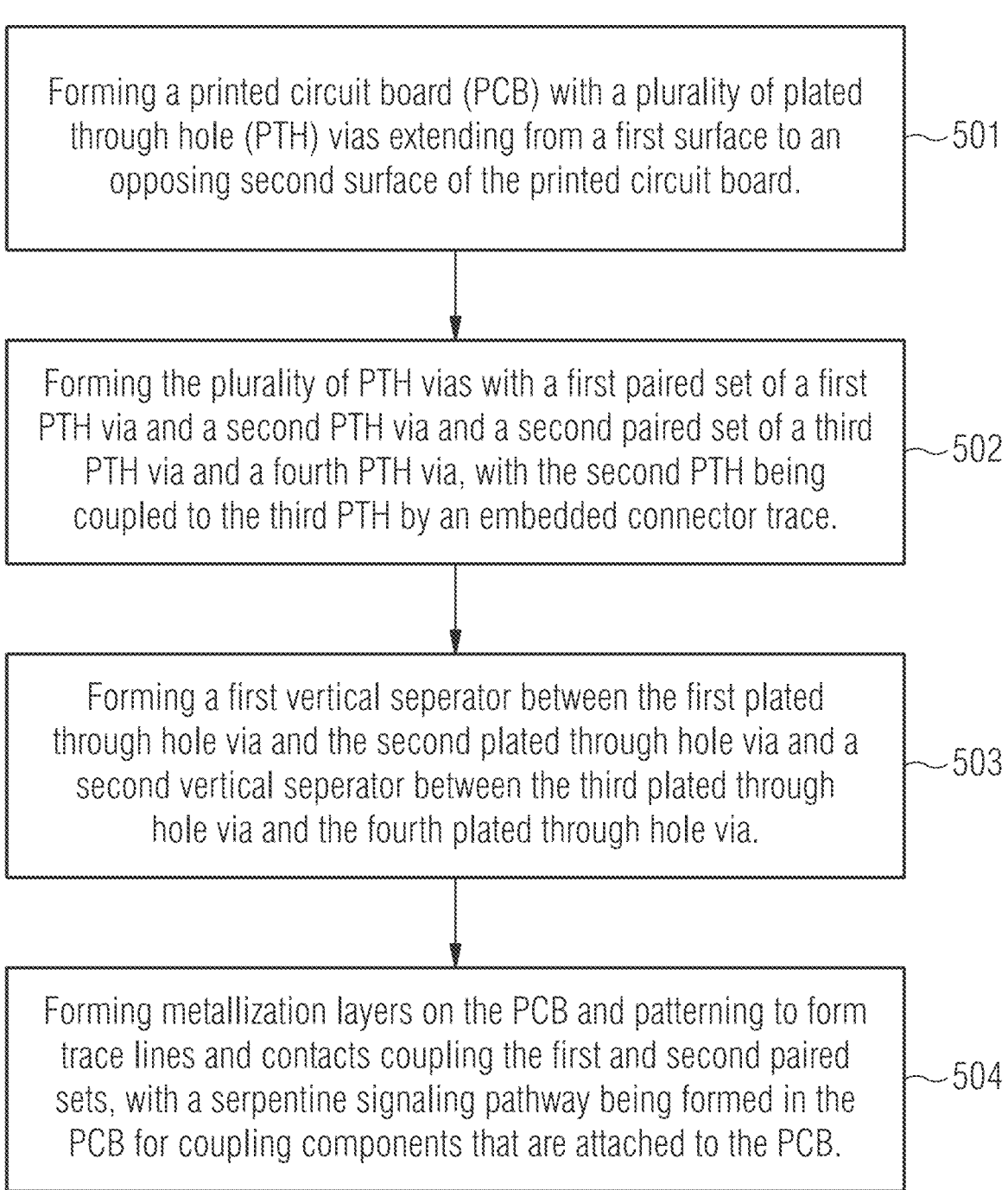

Forming a printed circuit board (PCB) with a plurality of plated through hole (PTH) vias extending from a first surface to an opposing second surface of the printed circuit board. —501

Forming the plurality of PTH vias with a first paired set of a first PTH via and a second PTH via and a second paired set of a third PTH via and a fourth PTH via, with the second PTH being coupled to the third PTH by an embedded connector trace. —502

Forming a first vertical seperator between the first plated through hole via and the second plated through hole via and a second vertical seperator between the third plated through hole via and the fourth plated through hole via. —503

Forming metallization layers on the PCB and patterning to form trace lines and contacts coupling the first and second paired sets, with a serpentine signaling pathway being formed in the PCB for coupling components that are attached to the PCB. —504

VERTICAL INTERCONNECT DESIGN FOR IMPROVED ELECTRICAL PERFORMANCE

BACKGROUND

In integrated circuit design and fabrication, the need to improve performance and lower costs are constant challenges. Many designs using conventional Type-3 printed circuit boards (PCB) produce plated through hole (PTH) stubs that are "unused". An unused stub is a conductive portion of the PTH that is orthogonal to the lateral traces and not connected in series in the circuit design. These unused stubs or "un-terminated" transmission lines may cause significant signal degradation around their resonant frequency (determined by the quarter wavelength of the structure).

For longer stubs, the resulting impedance discontinuity may cause a significant signal attenuation loss and reduce system performance. For example, a double data rate 5 dynamic random-access memory (DDR5) data rate of 6400 MT/s may be reduced by a couple of speed bins down to 6000 MT/s or 5600 MT/s. For high-speed differential I/O such as 40 Gbps TBT4, the platform channel length may need to be reduced from 8" to 6" to compensate for the electrical impairments caused by PTH stubs. In a typical Type-3 PCB design, the signaling path may have two or more PTH stubs in the end-to-end channel from a system on chip (SOC) to a receiver device e.g., a dynamic random access memory (DRAM) device.

One approach to address the issue of stubs is to use a more expensive Type-4 high density interconnect (HDI) PCB, which has micro-vias forming the vertical interconnection to facilitate signal routing at inner layers and does not have concerns caused by PTH stubs. However, this means a higher bill of materials (BOM) cost for major manufacturers. Another approach is the use of split core PCB designs with multiple thinner prepreg cores to reduce the impact of PTH stubs. While the split core PCB design approach resolves stub reflection effects, the asymmetry dielectric stack-up design may cause signaling degradation due to crosstalk coupling from adjacent high-speed interconnects.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 5 shows a simplified flow diagram for an exemplary method according to an aspect of the present disclosure.

DETAILED DESCRIPTION

Figure 1:
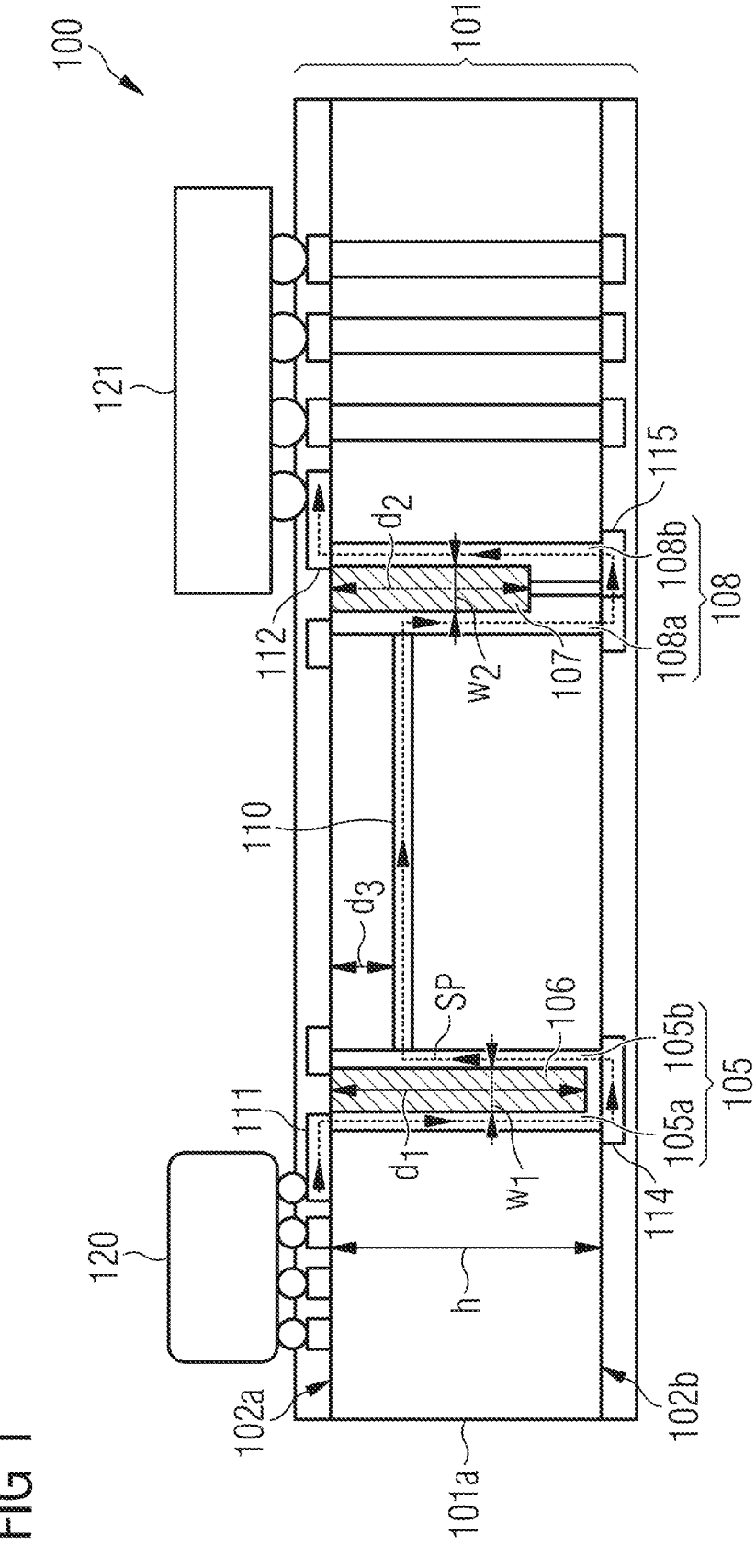
FIG. 1 shows an exemplary electronic assembly according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

In an aspect, the present disclosure is directed to a printed circuit board having a first surface and an opposing second surface. The printed circuit board may have a plurality of plated through hole vias extending from the first surface to the second surface, which includes a first set of paired plated through hole vias composed of a first plated through hole via coupled by a first contact pad to a second plated through hole via, and a first vertical separator being configured between the first and second plated through hole vias and extending a first depth from the first surface. The plurality of plated through hole vias also includes a second set of paired plated through hole vias composed of a third plated through hole via coupled by a second contact pad to a fourth plated through hole via, and a second vertical separator being configured between the third and fourth plated through hole vias and extending a second depth from the first surface. The printed circuit board may also have an embedded connector trace coupling the second plated through hole via to the third plated through hole via and being positioned at a third depth from the first surface that is less than the first depth of the first vertical separator or the second depth of the second vertical separator.

In another aspect, the present disclosure is directed to a first device providing a signal to a first trace line coupled to a first plated through hole vias on a signal pathway that continues to a second plated through hole vias, by way of a first contact pad that couples the first and second plated through hole vias. The signal pathway continues from the second plated through hole via following an embedded connector trace line to the third plated through hole via and to the fourth plated through hole via, by way of the second contact pad that couples the third and fourth plated through hole vias, and the signal continues on the signal pathway from the fourth plated through hole via to a second trace line coupled to a second device.

The technical advantages of the present disclosure include, but are limited to.

(i) Improved signal integrity performance may be achieved by reducing or removing open-ended PTH stubs on a signal pathway, thereby minimizing reflection noises. It can be observed that the insertion loss may be significantly reduced, from a worst-case of −35 dB to an improved −3 dB in a 15-20 GHz range. Also, from time-domain TDR analysis, the present electronic assemblies may have a reduced impedance deviation with reduced peak and valley impedances; a profile that is comparable to Type 4 PCBs that have no unused stub effects). The improvement of these key electrical impairments translates to better channel performance, in certain cases approximately 20% of eye margin improvement for high-speed bus e.g., a USB 3.0 bus running at 10 Gbps; and (ii) Platform miniaturization and platform z-direction height reduction may be achieved by avoiding the need for high-speed signal traces to compete for routing at the bottom PCB layers. Without PTH stub concerns, signals may be routed in the top PCB layers thus easing the routing congestion, which may lead to a reduced PCB layer count and ultimately to platform miniaturization and/or height reduction.

To more readily understand and put into practical effect the present printed circuit board design and methods, which may be used for electronic assemblies to improve their performance, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

FIG. 1 shows a cross-sectional view of an exemplary electronic assembly 100 according to an aspect of the present disclosure. The present electronic assembly 100 includes a printed circuit board (PCB) 101 with a laminated composite layer 101*a*, which has a first or top surface 102*a* and an opposing second or bottom surface 102*b*, and a plurality of plated through hole (PTH) vias in the printed circuit board 101 providing electrical connections. In an aspect, the distance or length between the first surface 102*a* and the second surface 102*b* is shown as "h". In an aspect, the present printed circuit board 101 may be a Type-3 PCB.

In an aspect, the plurality of PTH vias includes a first set of PTHs 105 having a first PTH 105*a* and second PTH 105*b*, which are paired, and a second set of PTHs 108 having a third PTH 108*a* and fourth PTH 108*b*, which are paired, as well as other PTHs. In an aspect, the first PTH 105*a* and second PTH 105*b* may be coupled by a first contact pad 114, and the third PTH 108*a* and fourth PTH 108*b* may be coupled by a second contact pad 115. In another aspect, the second PTH 105*b* may be coupled to the third PTH 108*a* by a connector trace 110, which may be positioned at a third depth $d_3$ as shown in FIG. 1. In yet another aspect, a first trace line 111 may be coupled to the first PTH 105*a* and a second trace line 112 may be coupled to the fourth PTH 108*b*.

In an aspect, the first PTH 105*a* and second PTH 105*b* may be formed as conjoining, as shown in FIG. 1, or spaced a short distance part similar to the third PTH 108*a* and fourth PTH 108*b*. The spacing between the pair of PTHs in the first and/or second set of PTHs 105 and 108 may be adjusted as needed to accommodate the various components in an electronic assembly to facilitate optimized electrical performance or manufacturability. A conjoined section between the first PTH 105*a* and second PTH 105*b* may also provide a signal pathway together with the first contact pad. It should be understood that different combinations of the paired PTHs being conjoined or spaced apart are within the scope of the present disclosure.

In addition, for the first set of PTHs 105, the first PTH 105*a* and second PTH 105*b* may be separated by a first vertical separator 106, and for the second set of PTHs 108, the third PTH 108*a* and fourth PTH 108*b* may be separated by a second vertical separator 107. In another aspect, the first vertical separator 106 may have a first depth $d_1$ and a first width $w_1$, and the second vertical separator 107 may have a second depth $d_2$ and a second width $w_2$.

In another aspect, the first depth $d_1$ of the first vertical separator 106 may be in the range of approximately 50% to 100% of the length h between the first surface 102*a* and the second surface 102*b*. In yet another aspect, the first width $w_1$ of the first vertical separator 106 may be in the range of approximately 100 μm to 400 μm. Similarly, in another aspect, the second depth $d_2$ of the second vertical separator 107 may be in the range of approximately 50% to 100% of the length h between the first surface 102*a* and the second surface 102*b*. In yet another aspect, the second width $w_2$ of the second vertical separator 107 may be in the range of approximately 100 μm to 400 μm. In an aspect, the length h is ranging in between 0.4 mm to 2.5 mm.

In a further aspect, the first depth $d_1$ of the first vertical separator 106 may have a different dimension from the second depth $d_2$ of the second vertical separator 107, e.g., the first depth being greater than the second depth, to facilitate optimized electrical performance or manufacturability. It should be understood that different combinations for the first depth $d_1$ of the first vertical separator 106 and the second depth $d_2$ of the second vertical separator 107 are within the scope of the present disclosure In a further aspect, the first width $w_1$ of the first vertical separator 106 may have a different dimension from the second width $w_2$ of the second vertical separator 107, e.g., the first width is greater than the second width, to facilitate optimized electrical performance or manufacturability.

In yet a further aspect, the first depth $d_1$ of the first vertical separator 106 and the second depth $d_2$ of the second vertical separator 107 may both have greater dimensions than the third depth $d_3$ of the connector trace 110 positioned in the PCB 101 to avoid the effects of unused PTH stubs.

In an aspect, the first and second vertical separators 106 and 107, respectively, may be made of a dielectric material; for example, an epoxy polymer resin composite layer, a silicone layer, or a polyimide layer. In another aspect, the first and second vertical separators 106 and 107, respectively, may be an air gap.

In addition, as shown in FIG. 1, a winding or serpentine signaling pathway SP between a first device 120 and a second device 121 may be created by the aforementioned elements for improved electrical performance in the electronic assembly 100. From the first device 120, the signaling pathway SP may follow the first trace line 111 through the first plated through hole vias 105*a* and through the first contact pad 114 to the second plated through hole vias 105*b*. The signaling pathway SP continues from the second plated through hole via 105*b* following the connector trace line 110 to the third plated through hole via 108*a* and through the second contact pad 115 to the fourth plated through hole via 108*b* on to the second trace line 112 coupled to the second device 121.

Figure 2:
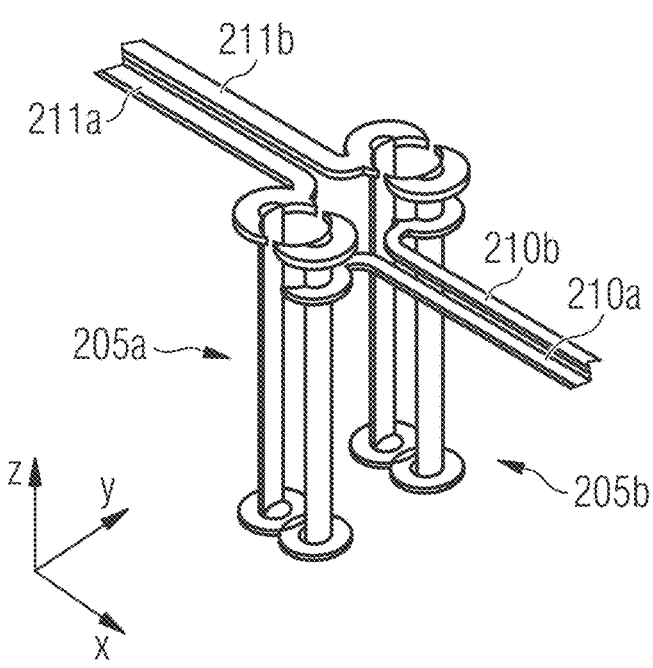
FIG. 2 shows an exemplary pair of complementary plated through hole vias for differential signaling and FIG. 2A shows certain features related thereto according to an aspect of the present disclosure.

FIG. 2 shows an exemplary "complimentary" (or essentially identical) pair of a first set of plated through hole vias 205*a* and 205*b* for a routing configuration useful for differential signaling according to an aspect of the present disclosure. A complimentary routing configuration facilitates an electrical signal transmission for differential pair interfaces, e.g., a universal serial bus Gen4 (USB4.0) Interface operating at ≥20 Gbps, a peripheral component interconnect express Gen5 (PCIe5) interface operating at 32 Gbps, or a serial-de-serializer (Serdes) ethernet interface operating at ≥112 Gbps. In an aspect, as shown in FIG. 2, a first trace line 211$a$ and a connector trace 210$a$ are arranged adjacent to a complimentary first trace line 211$b$ and a complementary connector trace 210$b$, respectively, to facilitate the transmission of a differential pair electrical signal. While not shown, it should be understood that the routing pathways before the first trace line 211$a$ and complementary first trace line 211$b$ and after the connector trace 210$a$ and the complementary connector trace 210$b$ are also identical.

Figure 2A:
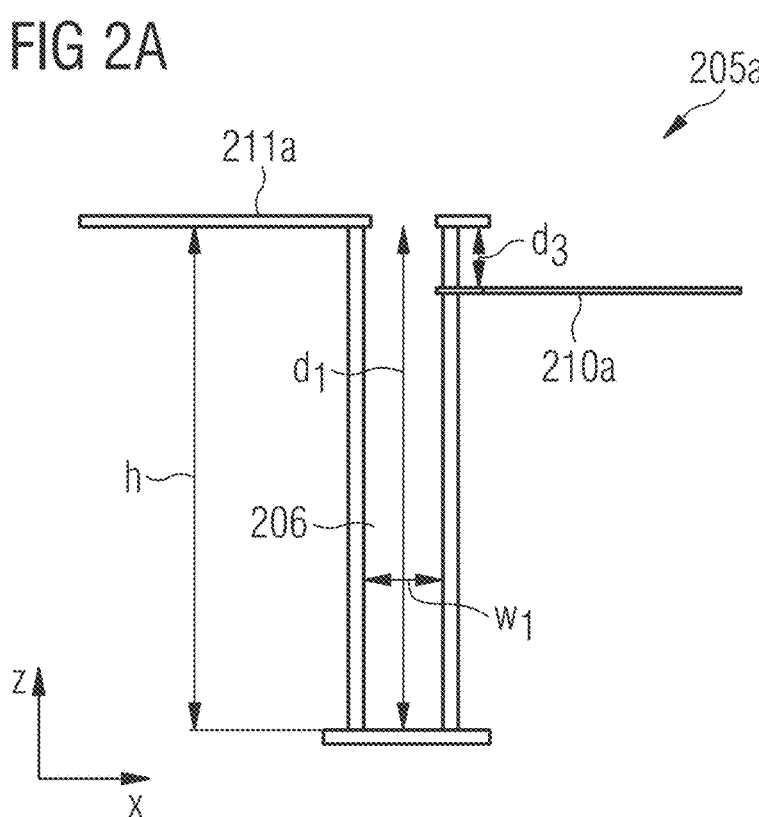

As shown in FIG. 2A, in a side view, the first set of paired plated through hole vias 205$a$ has a vertical separator 206, which may be an air gap that has a depth $d_1$ and a width $w_1$. According to an aspect of the present disclosure, the depth $d_1$ of the vertical separator 206 may be 100% of a length h between a first surface and a second surface of a laminated composite layer (not shown) and be greater than depth $d_3$ for the connector trace 210$a$.

Figure 3:
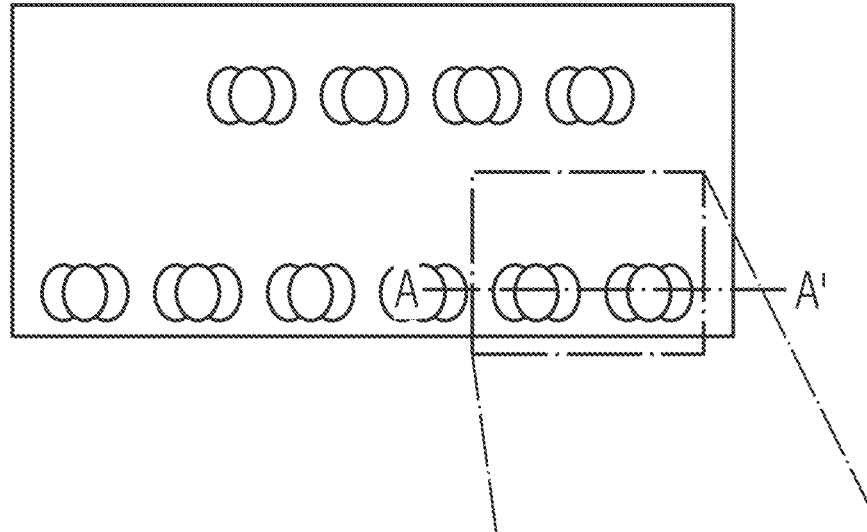
FIGS. 3 and 3A show representative images of spaces formed for vertical separators according to another aspect of the present disclosure.
Figure 3A:
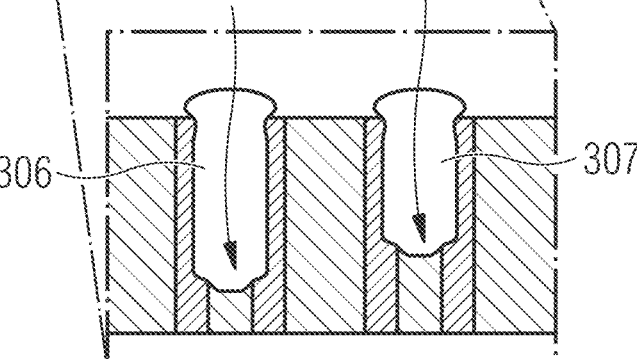

FIGS. 3 and 3A show representative images of spaces that may be formed and filled with a dielectric material for vertical separators 306 and 307 according to another aspect of the present disclosure. In FIG. 3, a series of spaces were formed between pairs of PTHs, and in the cross-sectional view provided in FIG. 3A, the depths of the spaces may be set at different depths for different pairs of PTHs.

FIGS. 4A through 4G show exemplary method steps for forming an electronic assembly according to another aspect of the present disclosure. It will be apparent to those ordinary skilled practitioners that the process operations disclosed herein below may be modified without departing from the spirit of the present disclosure.

Figure 4A:
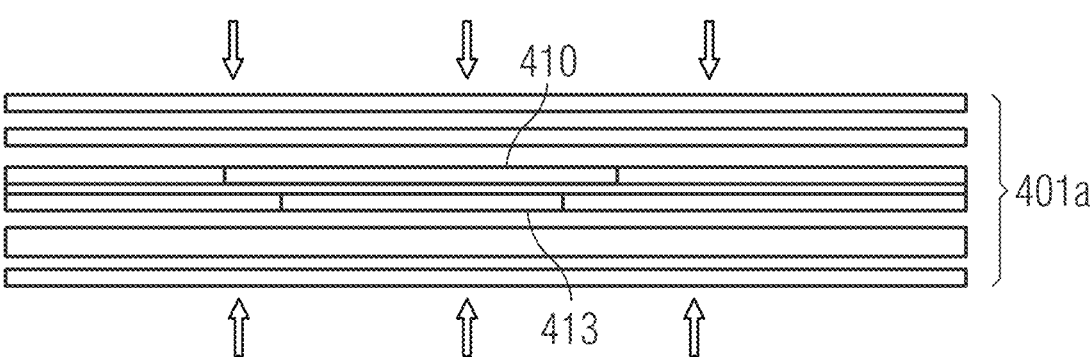
FIGS. 4A through 4G show exemplary method steps for forming an electronic assembly according to another aspect of the present disclosure.

FIG. 4A shows a laminated composite layer 401$a$ being formed. The flat laminated composite layer 401$a$ may be made from non-conductive substrate materials with layers of copper circuitry buried internally, such as a connector trace 410 and a copper cladded layer 413. It is within the scope of the present disclosure for the laminated composite layer 401$a$ to have four layers of copper, as shown in FIG. 4A, or in high-density applications, as many as fifty (50) layers or more. The lamination or stack-up may be formed by a standard hot press process.

Figure 4B:
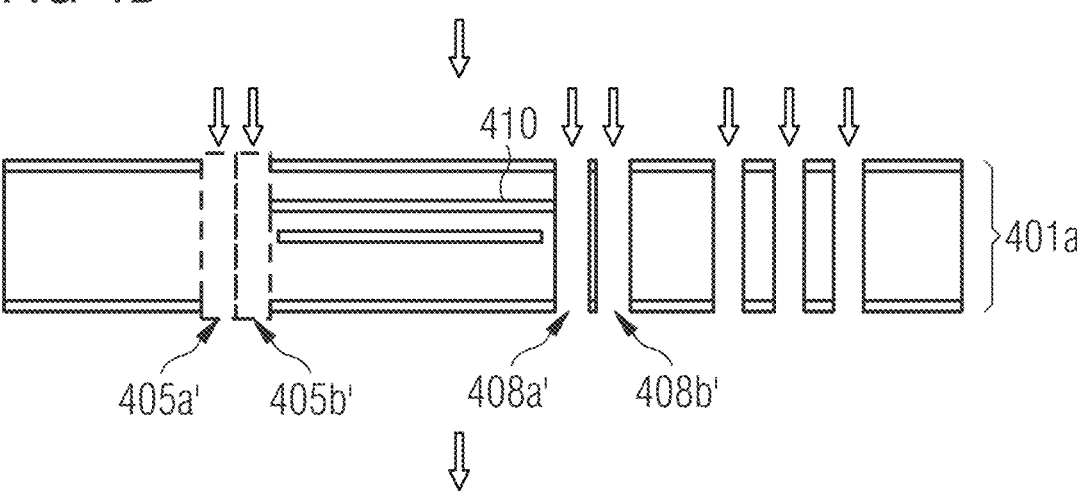

In FIG. 4B, a plurality of PTH via openings may be formed in laminated composite layer 401$a$ using laser drilling, waterjet drilling, or mechanical drilling process. The PTH via openings 405$a'$ and 405$b'$ may be conjoined as shown, while PTH via openings 408$a'$ and 408$b'$ may be separated by a small distance as shown.

Figure 4C:
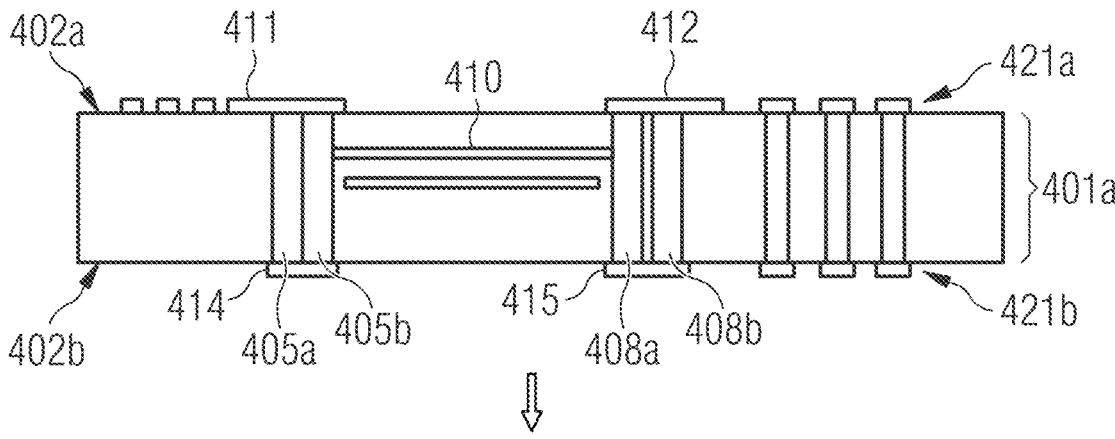

FIG. 4C shows the plurality of PTH via openings filled with a conductive material (e.g., copper) by standard electroless or electroplating processes to form the PTHs, including a first set of PTHs, with a first PTH 405$a$ and second PTH 405$b$, and a second set of PTH, with a third PTH 408$a$ and fourth PTH 408$b$, as well as other PTHs Thereafter, metallization layers 421$a$ and 421$b$ are deposited by a standard deposition process on a first surface 402$a$ and an opposing second surface 402$b$, respectively, of the laminated composite layer 401$a$. The metallization layer 421$a$ is shown patterned, by a standard etching process, as contact pads and a first trace line 411 and a second trace line 412, and the metallization layer 421$b$ is shown patterned, by a standard etching process, as contact pads, including a first contact pad 414 and a second contact pad 415.

Figure 4D:
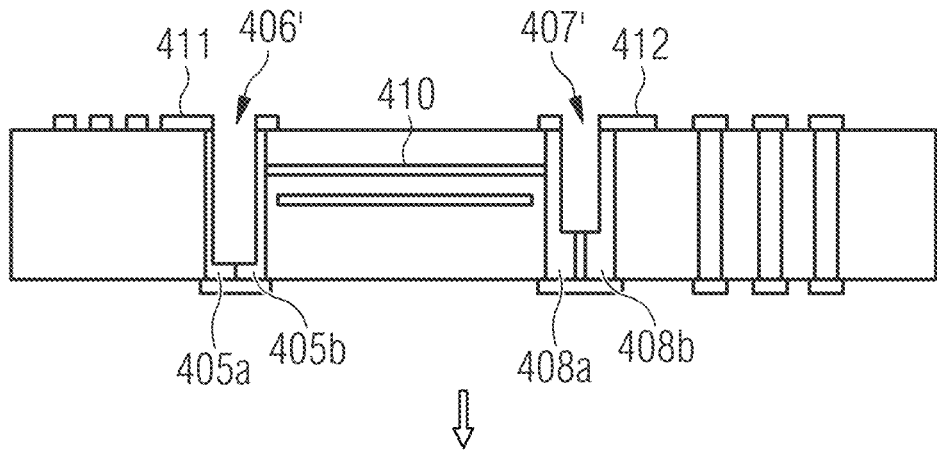

In FIG. 4D, a space 406' for a vertical separator may be formed between the first PTH 405$a$ and second PTH 405$b$, and a space 407' for a vertical separator may be formed between the third PTH 408$a$ and fourth PTH 408$b$. The spaces 406' and 407' may be formed using laser drilling, waterjet drilling, or mechanical drilling process. As shown in FIG. 4D, the space 406' has a greater depth than space 407'.

Figure 4E:
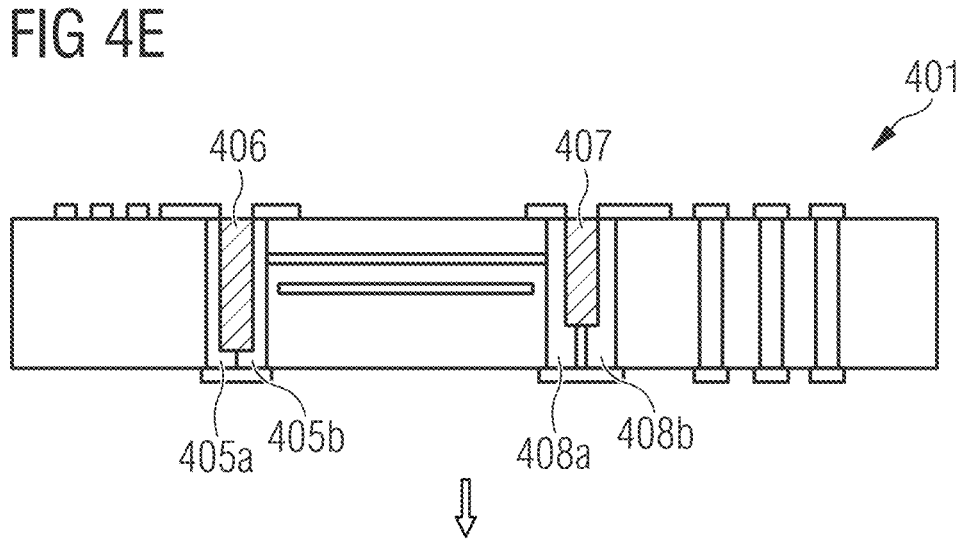

FIG. 4E shows a first vertical separator 406 formed between the first PTH 405$a$ and second PTH 405$b$, and a second vertical separator 407 formed between the third PTH 408$a$ and fourth PTH 408$b$. The first and second vertical separators 406 and 407 may be made of a dielectric material, such as an epoxy polymer resin composite layer, a silicone layer, or a polyimide layer, formed by conventional deposition methods, such as spin coating, a dispensing process, or plugging process In another aspect, the first and second vertical separators 406 and 407 may be an air gap.

Figure 4F:
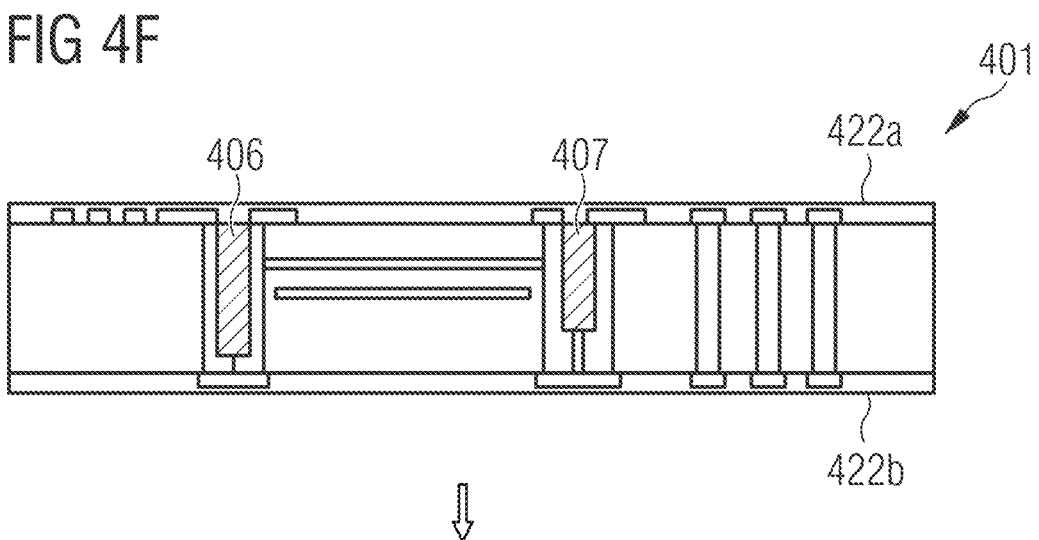

In FIG. 4F, a solder resist layer 422$a$ may be formed on a top surface and a solder resist layer 422$b$ on a bottom surface of the printed circuit board 401. The solder resist layers may be formed by standard methods, such as lamination, photolithography, and other deposition processes.

Figure 4G:
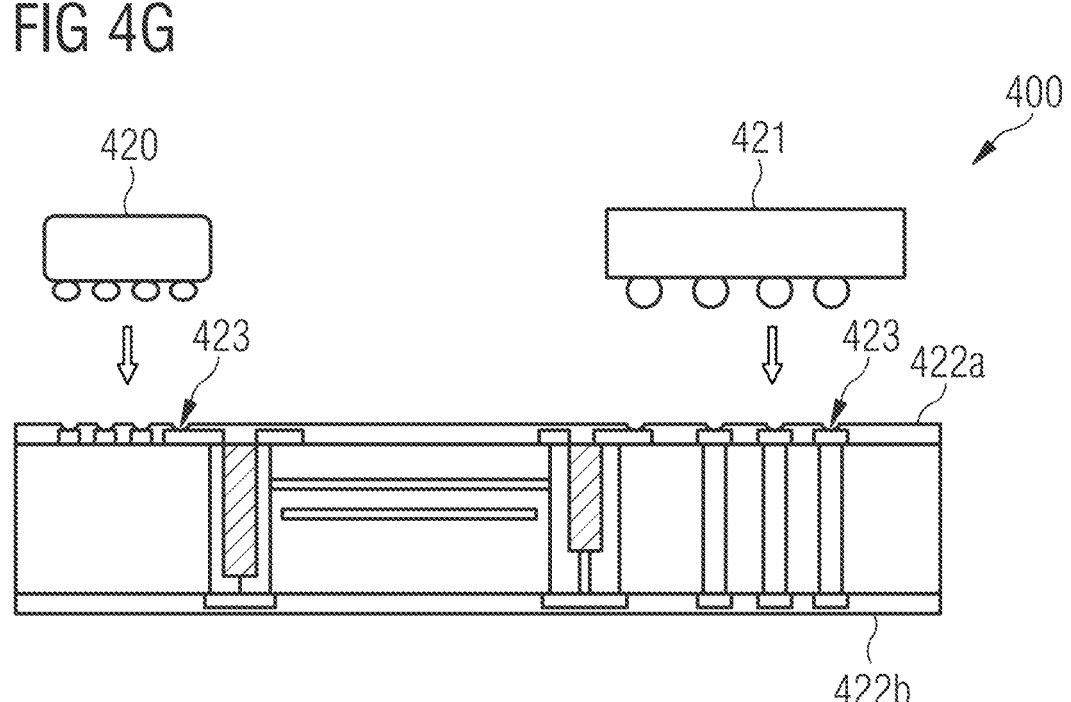

FIG. 4G shows the attachment of representative components, for example, a first device 420, which may be a DRAM or other memory device, and a second device 421, which may be a SOC or other processor, to form an electronic assembly 400. A plurality of openings 423 may be formed in the solder resist layer 422$a$ and the components may be attached by standard surface mount technology, such as solder reflow processes and other assembly processes.

FIG. 5 shows a simplified flow diagram for an exemplary method according to an aspect of the present disclosure. In an aspect, the present method may be able to provide electronic assemblies that minimize the effects of unused PTH stubs in printed circuit boards using a winding or serpentine signaling pathway.

The operation 501 may be directed to forming a printed circuit board (PCB) with a plurality of plated through hole (PTH) vias extending from a first surface to an opposing second surface of the printed circuit board.

The operation 502 may be directed to forming the plurality of PTH vias with a first paired set of a first PTH via and a second PTH via and a second paired set of a third PTH via and a fourth PTH via, with the second PTH being coupled to the third PTH by an embedded connector trace.

The operation 503 may be directed to forming a first vertical separator between the first plated through hole via and the second plated through hole via and a second vertical separator between the third plated through hole via and the fourth plated through hole via.

The operation 504 may be directed to forming metallization layers on the PCB and patterning to form trace lines and contacts coupling the first and second paired sets, with a serpentine signaling pathway being formed in the PCB for coupling components that are attached to the PCB.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present disclosure, they will now be described by way of examples. For the sake of brevity, duplicate descriptions of features and properties may be omitted.

EXAMPLES

Example 1 provides a printed circuit board including a first surface and an opposing second surface separated by a first length, a plurality of plated through hole vias extending from the first surface to the second surface, the plurality of plated through hole vias including a first set of plated through hole vias including a first plated through hole via coupled to a second plated through hole via, and a first vertical separator being configured between the first and second plated through hole vias, for which the first vertical separator extends a first depth from the first surface, a second set of plated through hole vias including a third plated through hole via coupled to a fourth plated through hole via, and a second vertical separator being configured between the third and fourth plated through hole vias, for which the second vertical separator extends a second depth from the first surface, and a connector trace coupling the second plated through hole via to the third plated through hole via, the connector trace being positioned at a third depth from the first surface, for which the third depth is less than the first depth or the second depth.

Example 2 may include the print circuit board of example 1 and/or any other example disclosed herein, for which the first plated through hole via and the second plated through hole via are conjoined and the first vertical separator at least partially separates the first and second plated through hole vias.

Example 3 may include the print circuit board of example 1 and/or any other example disclosed herein, further including a first trace line at the first surface of the printed circuit board coupled to the first plated through hole via and a second trace line at the first surface of the printed circuit board coupled to the fourth plated through hole via.

Example 4 may include the print circuit board of example 3 and/or any other example disclosed herein, further including a first contact pad at the second surface of the print circuit board, for which the first contact pad couples the first and second plated through hole vias, and a second contact pad at the second surface of the print circuit board, for which the second contact pad couples the third and fourth plated through hole vias.

Example 5 may include the print circuit board of example 4 and/or any other example disclosed herein, further including a signaling pathway following the first trace line to the first plated through hole vias and to the second plated through hole vias, for which the first contact pad is coupling the first and second plated through hole vias, and the signaling pathway continues from the second plated through hole via following the connector trace line to the third plated through hole via and to the fourth plated through hole via, for which the second contact pad is coupling the third and fourth plated through hole vias, and the signaling pathway continues from the fourth plated through hole via to the second trace line.

Example 6 may include the print circuit board of example 1 and/or any other example disclosed herein, for which the plurality of plated through hole vias further includes a complementary first set of plated through hole vias positioned adjacent to the first set of plated through holes vias, for which the complementary first set of plated through hole vias is configured with identical dimensions and coupled in an identical arrangement as the first set of plated through hole vias, a complementary second set of plated through hole vias positioned adjacent to the second set of plated through holes vias, for which the complementary second set of plated through hole vias configured with identical dimensions and coupled in an identical arrangement as the second set of plated through hole vias, and a complementary connector trace positioned adjacent to the connector trace, for which the complementary connector trace is configured with identical dimensions and coupled in an identical arrangement as the connector trace, for which the complementary first set of plated through hole vias, the complementary second set of plated through hole vias and the complementary connector trace provide a signal pathway for differential signaling.

Example 7 may include the print circuit board of example 1 and/or any other example disclosed herein, for which the first and second depths are in the range of approximately 50 to 100 percent of the first length.

Example 8 may include the print circuit board of example 1 and/or any other example disclosed herein, for which the first length is in the range of approximately 0.4 mm to 2.5 mm.

Example 9 may include the print circuit board of example 1 and/or any other example disclosed herein, for which the first depth of the first vertical separator is greater than the second depth of the second vertical separator.

Example 10 may include the print circuit board of example 1 and/or any other example disclosed herein, for which the first and second vertical separators further including a dielectric material or an air gap.

Example 11 may include the print circuit board of example 10 and/or any other example disclosed herein, for which the dielectric material further includes an epoxy polymer resin composite layer, a silicone layer, or a polyimide layer.

Example 12 provides an electronic assembly including a printed circuit board with a first surface and an opposing second surface including a plurality of plated through hole vias extending from the first surface to the second surface, the plurality of plated through hole vias including a first set of plated through hole vias including a first plated through hole via coupled to a second plated through hole via and a first vertical separator being configured between the first and second plated through hole vias, for which the first vertical separator extends a first depth from the first surface, a second set of plated through hole vias including a third plated through hole via coupled to a fourth plated through hole via, and a second vertical separator being configured between the third and fourth plated through hole vias, for which the second vertical separator extends a second depth from the first surface, and a connector trace coupling the second plated through hole via to the third plated through hole via, the connector trace being positioned at a third depth from the first surface, and a plurality of semiconductor devices position on the first surface of the printed circuit board.

Example 13 may include the electronic assembly of example 12 and/or any other example disclosed herein, for which the third depth of the connector trace is less than the first depth of the first vertical separator or the second depth of the second vertical separator.

Example 14 may include the electronic assembly of example 12 and/or any other example disclosed herein, for which the first plated through hole via and the second plated through hole via are conjoined and the first vertical separator at least partially separates the first and second plated through hole vias.

Example 15 may include the electronic assembly of example 12 and/or any other example disclosed herein, for which the plurality of semiconductor devices further includes a first device and a second device, the first device coupled to a first trace and the second device coupled to a second trace, and a signaling pathway following the first trace line to the first plated through hole vias and to the second plated through hole vias, for which the first contact pad is coupling the first and second plated through hole vias, and the signaling pathway continues from the second plated through hole via following the connector trace line to the third plated through hole via and to the fourth plated through hole via, for which the second contact pad is coupling the third and fourth plated through hole vias, and the signaling pathway continues from the fourth plated through hole via to the second trace line.

Example 16 provides a method including forming a printed circuit board with a first surface and an opposing second surface and at least one embedded connector trace line positioned therebetween, forming a plurality of plated through hole vias extending from the first surface to the second surface of the printed circuit board, the plurality of plated through hole vias including a first set of plated through hole vias including a first plated through hole via and a second plated through hole via, and a second set of plated through holes including a third plated through hole via and a fourth plated through hole via, for which the second plated through hole via is coupled to the third plated through hole via by the embedded connector trace line, forming a first metallization layer on the first surface of the printed circuit board and a second metallization on the second surface of the printed circuit board, and forming a first vertical separator between the first plated through hole via and the second plated through hole via and a second vertical separator between the third plated through hole via and the fourth plated through hole via.

Example 17 may include the method of example 16 and/or any other example disclosed herein, further including patterning the first metallization layer on the first surface of the printed circuit board to form a first plurality of contact pads and first and second trace lines, for which the first trace line is coupled to the first plated through hole via and the second trace line is coupled to the fourth plated through hole via, and patterning the second metallization on the second surface of the printed circuit board to form a second plurality of contact pads, the second plurality of contact pads including a first contact pad coupling the first plated through hole via and the second plated through hole via and a second contact pad coupling the third plated through hole via and the fourth plated through hole via.

Example 18 may include the method of example 16 and/or any other example disclosed herein, for which forming the first vertical separator further includes forming a first gap having a first depth and first width between the first plated through hole via and the second plated through hole via, and for which forming a second vertical separator further includes forming a second gap having a second depth and second width between the third plated through hole via and the fourth plated through hole via.

Example 19 may include the method of example 18 and/or any other example disclosed herein, for which forming a plurality of plated through hole vias further includes conjoining the first plated through hole via and the second plated through hole via and having the first vertical separator at least partially separates the first and second plated through hole vias.

Example 20 may include the method of example 17 and/or any other example disclosed herein, providing a signal to the first trace line coupled to the first plated through hole vias on a signal pathway that continues to the second plated through hole vias, by way of the first contact pad that couples the first and second plated through hole vias, and the signal continues from the second plated through hole via following the embedded connector trace line to the third plated through hole via and to the fourth plated through hole via, by way of the second contact pad that couples the third and fourth plated through hole vias, and the signal continues on the signal pathway from the fourth plated through hole via to the second trace line.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A printed circuit board comprising:
a first surface and an opposing second surface separated by a first length;
a plurality of plated through hole vias extending from the first surface to the second surface, the plurality of plated through hole vias comprising:
a first set of plated through hole vias comprising a first plated through hole via electrically coupled by way of an electrical signal pathway through a pad at either the first surface or the second surface to a second plated through hole via, and a first vertical separator being configured between the first and second plated through hole vias, wherein the first vertical separator extends a first depth from the first surface;
a second set of plated through hole vias comprising a third plated through hole via coupled to a fourth plated through hole via, and a second vertical separator being configured between the third and fourth plated through hole vias, wherein the second vertical separator extends a second depth from the first surface; and
a connector trace coupling the second plated through hole via to the third plated through hole via, the connector trace being positioned at a third depth from the first surface, wherein the third depth is less than the first depth or the second depth.

2. The printed circuit board of claim 1, wherein the first plated through hole via and the second plated through hole via are conjoined and the first vertical separator at least partially separates the first and second plated through hole vias.

3. The printed circuit board of claim 1, further comprising a first trace line at the first surface of the printed circuit board coupled to the first plated through hole via and a second trace line at the first surface of the printed circuit board coupled to the fourth plated through hole via.

4. The printed circuit board of claim 3, further comprising:

a first contact pad at the second surface of the printed circuit board, wherein the first contact pad couples the first and second plated through hole vias; and a second contact pad at the second surface of the printed circuit board, wherein the second contact pad couples the third and fourth plated through hole vias.

5. The printed circuit board of claim 4, further comprising:

a signaling pathway following the first trace line to the first plated through hole vias and to the second plated through hole vias, wherein the first contact pad is coupling the first and second plated through hole vias, and the signaling pathway continues from the second plated through hole via following the connector trace to the third plated through hole via and to the fourth plated through hole via, wherein the second contact pad is coupling the third and fourth plated through hole vias, and the signaling pathway continues from the fourth plated through hole via to the second trace line.

6. The printed circuit board of claim 1, wherein the plurality of plated through hole vias further comprises:

a complementary first set of plated through hole vias positioned adjacent to the first set of plated through holes vias, wherein the complementary first set of plated through hole vias is configured with identical dimensions and coupled in an identical arrangement as the first set of plated through hole vias;

a complementary second set of plated through hole vias positioned adjacent to the second set of plated through holes vias, wherein the complementary second set of plated through hole vias configured with identical dimensions and coupled in an identical arrangement as the second set of plated through hole vias; and a complementary connector trace positioned adjacent to the connector trace, wherein the complementary connector trace is configured with identical dimensions and coupled in an identical arrangement as the connector trace, wherein the complementary first set of plated through hole vias, the complementary second set of plated through hole vias and the complementary connector trace provides a signal pathway for differential signaling.

7. The printed circuit board of claim 1, wherein the first and second depths are in a range of approximately 50 to 100 percent of the first length.

8. The printed circuit board of claim 1, wherein the first length is in a range of approximately 0.4 mm to 2.5 mm.

9. The printed circuit board of claim 1, wherein the first depth of the first vertical separator is greater than the second depth of the second vertical separator.

10. The printed circuit board of claim 1, wherein the first and second vertical separators further comprise a dielectric material or an air gap.

11. The printed circuit board of claim 10, wherein the dielectric material further comprises an epoxy polymer resin composite layer, a silicone layer, or a polyimide layer disposed between the first plated through hole via and the second plated through hole via to provide electrical isolation between portions of the first plated through hole via and the second plated through hole via.

12. An electronic assembly comprising:

a printed circuit board with a first surface and an opposing second surface comprising:

a plurality of plated through hole vias extending from the first surface to the second surface, the plurality of plated through hole vias comprising: a first set of plated through hole vias comprising a first plated through hole via electrically coupled by way of an electrical signal pathway through a pad at either the first surface or the second surface to a second plated through hole via and a first vertical separator being configured between the first and second plated through hole vias, wherein the first vertical separator extends a first depth from the first surface; a second set of plated through hole vias comprising a third plated through hole via coupled to a fourth plated through hole via, and a second vertical separator being configured between the third and fourth plated through hole vias, wherein the second vertical separator extends a second depth from the first surface; and a connector trace coupling the second plated through hole via to the third plated through hole via, the connector trace being positioned at a third depth from the first surface; and a plurality of semiconductor devices positioned on the first surface of the printed circuit board.

13. The electronic assembly of claim 12, wherein the third depth of the connector trace is less than the first depth of the first vertical separator or the second depth of the second vertical separator.

14. The electronic assembly of claim 12, wherein the first plated through hole via and the second plated through hole via are conjoined and the first vertical separator at least partially separates the first and second plated through hole vias.

15. The electronic assembly of claim 12, wherein the plurality of semiconductor devices further comprises:

a first device and a second device, the first device coupled to a first trace and the second device coupled to a second trace; and a signaling pathway following the first trace to the first plated through hole vias and to the second plated through hole vias, wherein a first contact pad is coupling the first and second plated through hole vias, and the signaling pathway continues from the second plated through hole via following the connector trace to the third plated through hole via and to the fourth plated through hole via, wherein a second contact pad is coupling the third and fourth plated through hole vias, and the signaling pathway continues from the fourth plated through hole via to the second trace.

16. A method comprising:

forming a printed circuit board with a first surface and an opposing second surface and at least one embedded connector trace line positioned therebetween;

forming a plurality of plated through hole vias extending from the first surface to the second surface of the printed circuit board, the plurality of plated through hole vias comprising a first set of plated through hole vias comprising a first plated through hole via and a second plated through hole via, and a second set of plated through holes comprising a third plated through hole via and a fourth plated through hole via, wherein the second plated through hole via is coupled to the third plated through hole via by the embedded connector trace line;

forming a first metallization layer on the first surface of the printed circuit board and a second metallization on the second surface of the printed circuit board; and removing a portion of layers of the printed circuit board between the first plated through hole via and the second plated through hole via to form a first vertical separator between the first plated through hole via and the second plated through hole via and a second vertical separator between the third plated through hole via and the fourth plated through hole via.

17. The method of claim 16, further comprising:

patterning the first metallization layer on the first surface of the printed circuit board to form a first plurality of contact pads and first and second trace lines, wherein the first trace line is coupled to the first plated through hole via and the second trace line is coupled to the fourth plated through hole via; and patterning the second metallization on the second surface of the printed circuit board to form a second plurality of contact pads, the second plurality of contact pads comprising a first contact pad coupling the first plated through hole via and the second plated through hole via and a second contact pad coupling the third plated through hole via and the fourth plated through hole via.

18. The method of claim 16, wherein forming the first vertical separator further comprises forming a first gap having a first depth and first width between the first plated through hole via and the second plated through hole via; and wherein forming a second vertical separator further comprises forming a second gap having a second depth and second width between the third plated through hole via and the fourth plated through hole via.

19. The method of claim 18, wherein forming a plurality of plated through hole vias further comprises conjoining the first plated through hole via and the second plated through hole via and having the first vertical separator at least partially separates the first and second plated through hole vias.

20. The method of claim 17, further comprising:

providing a signal to the first trace line coupled to the first plated through hole vias on a signal pathway that continues to the second plated through hole vias, by way of the first contact pad that couples the first and second plated through hole vias, and the signal continues from the second plated through hole via following the embedded connector trace line to the third plated through hole via and to the fourth plated through hole via, by way of the second contact pad that couples the third and fourth plated through hole vias, and the signal continues on the signal pathway from the fourth plated through hole via to the second trace line.

\* \* \* \* \*